United States Patent
Yoshioka et al.

(10) Patent No.: US 6,671,949 B2
(45) Date of Patent: Jan. 6, 2004

(54) MULTILAYER PRINTED WIRING BOARD AND METHOD FOR MANUFACTURING SAME

(75) Inventors: Hirokazu Yoshioka, Osaka (JP); Norio Yoshida, Nara (JP); Kenichiro Tanaka, Izumi (JP)

(73) Assignee: Matsushita Electric Works, Ltd., Osaka (JP)

( * ) Notice: Subject to any disclaimer, the term of this patent is extended or adjusted under 35 U.S.C. 154(b) by 276 days.

(21) Appl. No.: 09/808,086

(22) Filed: Mar. 13, 2001

(65) Prior Publication Data

US 2003/0188888 A1 Oct. 9, 2003

Related U.S. Application Data

(62) Division of application No. 09/321,644, filed on May 28, 1999, now Pat. No. 6,326,559.

(30) Foreign Application Priority Data

Jun. 30, 1998 (JP) .......................................... 10-185108

(51) Int. Cl.[7] ................................................. H01K 3/10
(52) U.S. Cl. ............................ 29/852; 29/846; 29/847; 29/848; 29/849; 438/637; 438/640
(58) Field of Search ........................ 29/846, 847, 848, 29/849, 852, 853; 438/667, 637, 640; 216/17, 18, 19, 83, 99; 219/121.69; 205/125; 427/96–98; 174/261, 255, 262, 266, 265

(56) References Cited

U.S. PATENT DOCUMENTS

| | | | |
|---|---|---|---|
| 4,070,501 A | | 1/1978 | Corbin et al. |
| 5,390,412 A | * | 2/1995 | Gregoire ...................... 29/848 |
| 5,451,722 A | * | 9/1995 | Gregoire ..................... 174/261 |
| 5,564,181 A | * | 10/1996 | Dineen et al. ................. 29/841 |
| 5,746,868 A | * | 5/1998 | Abe ............................ 156/247 |
| 5,956,843 A | * | 9/1999 | Mizumoto et al. ............ 29/852 |
| 6,240,636 B1 | * | 6/2001 | Asai et al. ..................... 29/852 |
| 6,266,874 B1 | * | 7/2001 | DiStefano et al. ............ 29/846 |
| 6,280,641 B1 | * | 8/2001 | Gaku et al. .................... 216/17 |
| 6,379,159 B1 | * | 4/2002 | Mune et al. ................... 439/71 |
| 6,460,247 B1 | * | 10/2002 | Gregoire ....................... 29/848 |

FOREIGN PATENT DOCUMENTS

| | | |
|---|---|---|
| JP | 4-3676 | 1/1992 |
| JP | 8-279679 | 10/1996 |
| JP | 9-107167 | 4/1997 |
| JP | 9-321432 | 12/1997 |

* cited by examiner

Primary Examiner—Carl J. Arbes
Assistant Examiner—David Nguyen
(74) Attorney, Agent, or Firm—Lynn & Lynn (57) ABSTRACT

A multilayer printed wiring board is formed with a plurality of conductor layers laminated as a whole with insulating layers interposed, a non-penetrating via hole provided in the insulating layer as bottomed by the conductor layer exposed, a plated layer provided inside the via hole for electric connection between the conductor layers, the via hole being formed to be of a concave curved surface of a radius in a range of 20 to 100 $\mu$m in axially sectioned view at continuing zone of inner periphery to bottom surface of the via hole, whereby the equipotential surfaces occurring upon plating the plated layer are curved along the continuing zone to unify the density of current for rendering the plated layer uniform in the thickness without being thinned at the continuing zone.

9 Claims, 12 Drawing Sheets

MULTILAYER PRINTED WIRING BOARD AND METHOD FOR MANUFACTURING SAME

This is a division of application Ser. No. 09/321,644 filed May 28, 1999 now U.S. Pat. No. 6,326,559.

BACKGROUND OF THE INVENTION

This invention relates to a multilayer printed wiring board constituted for electric connection between multiple conductor layers by means of a so-called via hole of non-penetrating type, and to a method for manufacutring same.

DESCRIPTION OF RELATED ART

In the multilayer printed wiring board comprising a lamination of a plurality of conductor layers forming a circuit with insulating layers interposed, the electric connection between the conductor layers is generally attained by forming through holes with a drilling work, and providing a plated metal layer on inner peripheries of the through holes.

In order to establish the wiring at a higher density in recent years, however, there has been started to be widely employed a measure in which the non-penetrating via hole instead of the through hole is formed in the insulating layer, and an electrically conducting substance is provided to the inner periphery of the via hole. For a process of forming this non-penetrating via hole, it has been general to remove through an etching a portion of a metal layer formed on a surface of the insulating layer, at which portion the via hole is to be formed, and then to irradiate a carbon dioxide gas laser onto the thus exposed insulating layer formed by a thermosetting resin or the like so as to provide the via hole in the insulating layer at the portion where the metal layer has been removed.

The method for manufacturing the multilayer printed wiring board with the via hole formed by means of such laser irradiation has been disclosed, in, for example, Japanese Patent Publication No. 4-3676 by Y. Ohsachi et al., according to which an aperture of the same diameter as that of the via hole is formed first through the top metal layer by means of the etching or the like at the position where the via hole is to be made, then the non-penetrating via hole bottomed by an internal conductor layer is formed in the insulating layer with the laser irradiation of the carbon dioxide gas laser or the like at the position where the aperture has been formed, thereafter a metal foil is formed on inner periphery of the via hole by means of a plating, the metal foil is processed through the etching to form a circuit which connects the metal layer and the internal conductor layer through the metal foil, and the multilayer printed wiring board in which a plurality of the metal and conductor layers are electrically connected through the plated metal foils in the via holes thus formed is obtained.

In providing the via hole in the insulating layer with the laser irradiation as has been described, a continuing zone of the inner periphery of the via hole to the bottoming internal conductor layer becomes an angular shape close to be 90° in an axially sectioned view of the via hole, so long as the inner periphery of the via hole is of a vetical wall. In providing to such periphery of the via hole the plated metal foil, a thin, electrolessly plated film is first formed through an electroless copper plating or the like plating on the inner periphery of the via hole, and thereafter the metal foil is formed by means of an electro-copper-plating or the like electroplating with a current passed through the plate film. Equipotential surfaces occurring inside the via hole during the electroplating will be parallel to the inner periphery and to the bottom conductor layer of the via hole but will deflect at the continuing zone of the inner periphery of the via hole to the bottom conductor layer, whereby the electric lines of force intersecting at right angles the equipotential surfaces are caused to be coarse at the deflected part of the equipotential surfaces so as to render the current density to be smaller at this part. Also, plating solution is deteriorated in the fluidity at the continuing zone.

Consequently, the plated metal foil formed in the via hole becomes extremely thin at the continuing zone of the inner periphery of the via hole to the bottom conductor layer so as to lower the reliability of the electric connection between the respective conductor layers through the plated metal foil, so that a problem rises in that the connection is broken frequently at such extremely thin part of the metal foil due to a heating upon mounting costituent parts or a generated heat at the mounted parts being used.

In U.S. Pat. No. 4,070,501 to V. Carbine et al., on the other hand, there has been disclosed a provision of the via hole, which is an element in a semiconductor device and is not suggestive to any technical matter characteristic to the multilayer printed wiring board. Japanese Pat. Laid-Open Publication No. 8-279679 of H. Takagi et al. and assigned to the same assignee as the present invention also disclose a formation of the via hole but involves the same problem as in the foregoings.

SUMMARY OF THE INVENTION

The present invention has been suggested to overcome the foregoing problem, and an object of the invention is to provide a multilayer printed wiring board high in the reliability of the electric connection between the conductor layers through the plated metal foil in the via hole as well as a method for manufacturing such multilayer printed wiring board.

According to the present invention, the above object can be realized by means of a multilayer printed wiring board in which a plurality of conductor layers are laminated as a whole with insulating resin layers respectively interposed, a non-penetrating via hole is provided in the respective insulating layers as bottomed by each conductor layer exposed, and a plated layer is provided in the via hole for electric connection between the respective conductor layers, wherein the via hole is formed at least at a continuing zone of inner periphery to bottom surface to be of a concave curved surface of a radius of 20 to 100 $\mu$m in axially sectioned view of the via hole.

Other objects and advantages of the present invention shall become clear as the description advances as detailed with reference to embodiments shown in accompanying drawings.

BRIEF DESCRIPTION OF THE DRAWINGS

FIG. 2A is an explanatory view for that a plated layer becomes larger in the thickness than in the past at concave curved surface in continuing zone of inner periphery to bottom surface of via hole;

FIG. 2B*a* is an explanatory view for a plated layer formed according to the present invention;

FIG. 2B*b* is an explanatory view for a plated layer formed according to a conventional manner;

FIGS. 3(*a*) to 3(*f*) are fragmentary sectioned views showing the board in the respective steps in another embodiment according to the present invention;

FIGS. 4(*a*) to 4(*f*) are fragmentary sectioned views showing the board in the respective steps in another embodiment according to the present invention;

FIGS. 5(*a*) to 5(*d*) are fragmentary sectioned views showing the board in the respective steps in another embodiment according to the present invention;

FIGS. 6(*a*) to 6(*g*) are fragmentary sectioned views showing the board in the respective steps in another embodiment according to the present invention;

FIGS. 7(*a*) to 7(*g*) are fragmentary sectioned views showing the board in the respective steps in another embodiment according to the present invention;

FIGS. 8(*a*) to 8(*g*) are fragmentary sectioned views showing the board in the respective steps in another embodiment according to the present invention;

FIGS. 9(*a*) to 9(*g*) are fragmentary sectioned views showing the board in the respective steps in another embodiment according to the present invention;

FIGS. 10(*a*) and 10(*b*) are fragmentary sectioned views showing the board in the respective steps in another embodiment according to the present invention.

While the present invention shall now be described with reference to the respective embodiments shown in the accompanying drawings, it should be appreciated that the intention is not to limit the invention only to these embodiments shown but rather to include all alterrations, modifications and equivalent arrangements possible within the scope of appended claims.

DETAILED DESCRIPTION OF THE PREFERRED EMBODIMENTS

Figure 1A:
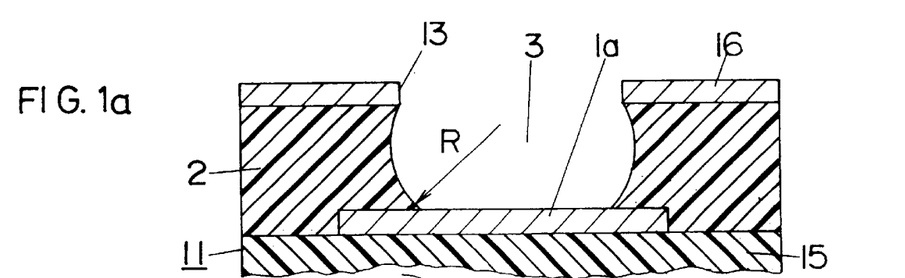
FIGS. 1(a) to 1(c) are fragmentary sectioned views showing the board in an embodiment according to the present invention in a sequence of respective steps of manufacturing method for the board.
Figure 1B:
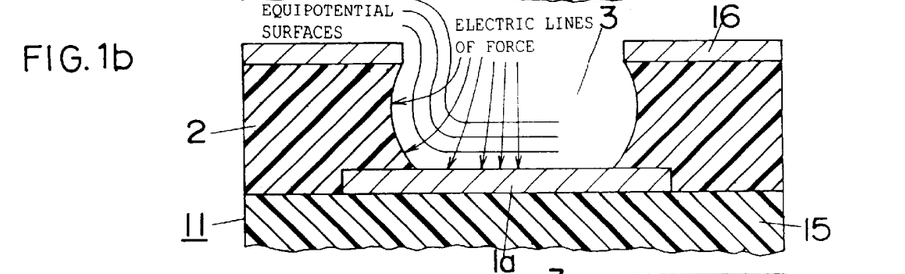
Figure 1C:
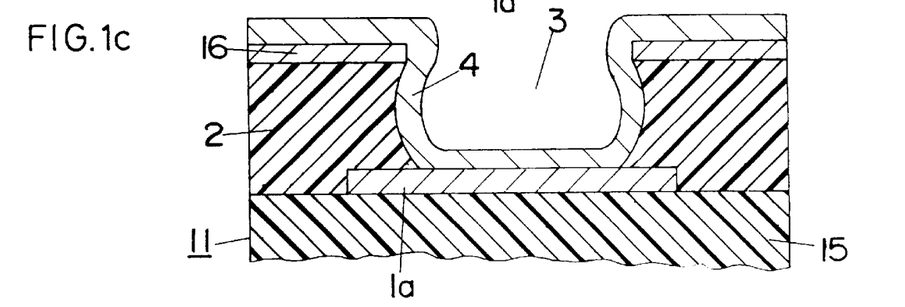

FIGS. 1(*a*) to 1 (*c*) show an embodiment of the method for manufacturing the multilayer printed wiring board according to the present invention, and FIGS. 2(*a*) to 2(*f*) show more concrete aspects of the steps in FIG. 1. Referring in detail to the present embodiment by references to FIGS. 1 and 2, a multilayer substrate 11 shown in FIG. 2(*a*) is formed by laminating a metal layer 16 through an insulating layer 2 on an inner layering substrate 15 provided on a surface with a conductor layer 1*a* by a wiring pattern formation. The inner layering substrate 15 employable here is one prepared by forming the conductor layer 1*a* in a circuit through a wiring pattern processing made with respect to, for example, a copper foil on a copper clad laminate of glass-cloth base epoxy resin, and the conductor layer 1*a* should preferably be subjected to such surface treatment as a surface roughening or the like. Further, the insulating layer 2 can be formed with such thermosetting resin or the like as epoxy resin, polyimide and the like, and the metal layer 16 laminated on the surface of the insulating layer 2 may be formed by means of a plating, thermocompression bonding of a metal foil and so on. Further, the multilayer substrate 11 can be also manufactured by providing preliminarily a thermosetting resin layer in a half-set state for forming the insulating layer 2 on one surface of a metal foil for forming the metal layer 16, and bonding under the thermocompression the metal foil on its side of the thermosetting resin layer onto the surface of the inner layering substrate 15. In this manner, the insulating layer 2 may only be formed on either side or on both sides of the inner layering substrate 15, and either one of the steps can be properly selected.

The insulating layer 2 may contain a filler of an inorganic powder, if required. While not specifically limited, such inorganic fibers as glass fibers which are apt to be hindering to the formation of a via hole 3 by means of a carbon dioxide gas laser should preferably be not used. In an event when the insulating layer 2 is formed by means of a coating or the like of a resin composition containing a solvent, it is preferable that the solvent is removed with a heating therefor, prior to a setting with a heat. For the metal foil to be used as the metal layer 16, copper foil, aluminum foil, nickel foil and the like may be enumerated but, from a view point of availability or function, copper foil should desirably be used.

With the foregoing multilayer substrate 11 employed, the metal layer 16 at a position where the via hole 3 is to be formed is removed as shown in FIG. 2(*a*) to form an opening 13. The position where the via hole 3 is formed is to be set at part corresponding to the conductor layer 1*a* on the inner layering substrate 15, and, while not specifically limited, an etching or the like process may be employed as a process for removing the metal layer 16.

A concrete example of the steps for manufacturing the multilayer substrate 11 and for forming the opening 13 in the metal layer 16 is shown. First, a both-surface copper clad laminate of FR-4 type (the laminate being 1.0 mm thick, and the copper foil being 18 μm thick) was used, the conductor layer 1*a* to be the inner layer circuit was formed by means of a wiring pattern processing with respect to the copper foil on one surface, the copper foil on the other surface was etched off overall, and the inner layering substrate 15 was prepared. This substrate Was dipped in an aqueous solution of 2% copper chloride and 7% hydrochloric acid at 30° C., to have a surface of the conductor layer 1*a* subjected to an etching surface-roughening process.

On the other hand, an epoxy resin varnish containing as main components bisphenol A epoxy resin and dicyandiamide and generally used for manufacturing the FR-4 type laminate was applied onto the roughened bonding surface (mat finished) of the 18 μm thick copper foil with a comma coater employed, so as to be 70 μm thick after being dried, the varnish was heated to be dried under conditions of 150° C. and 20 minutes, so as to be half-set (to be in B stage), and a copper foil lined with resin was prepared.

The resin-lined copper foils were placed over both surfaces of the inner layering substrate 15 with the resin side of the foils faced to the substrate, and the multilayer substrate 11 in which the inner layering substrate 15 carries the metal layer 16 laminated through the insulating layer 2, as shown in FIG. 2(*a*), through a heat/pressure molding under conditions of 30 kg/cm$^2$, at 170° C. and for 120 minutes.

Next, an etching resist film (dry film) was applied to top surface of the metal layer 16, the film was subjected to an exposure to light and an development, the metal layer 16 at the portion where the via hole 3 was to be formed was removed through an etching, and the opening 13 of φ100 μm was formed therein as in FIG. 2(*b*).

Figure 11:
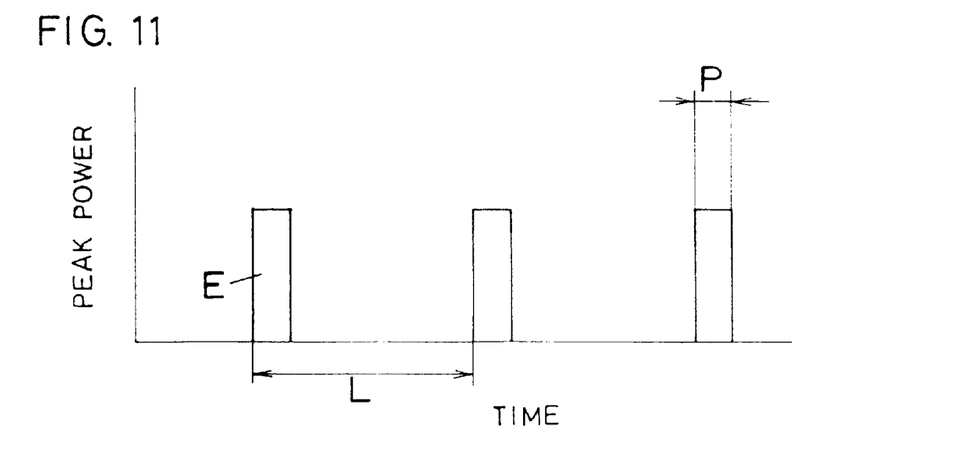
FIGS. 11 to 13 are diagrams showing respectively each of examples of irradiation aspects of carbon dioxide gas laser in further embodiments according to the present invention.
Figure 12:
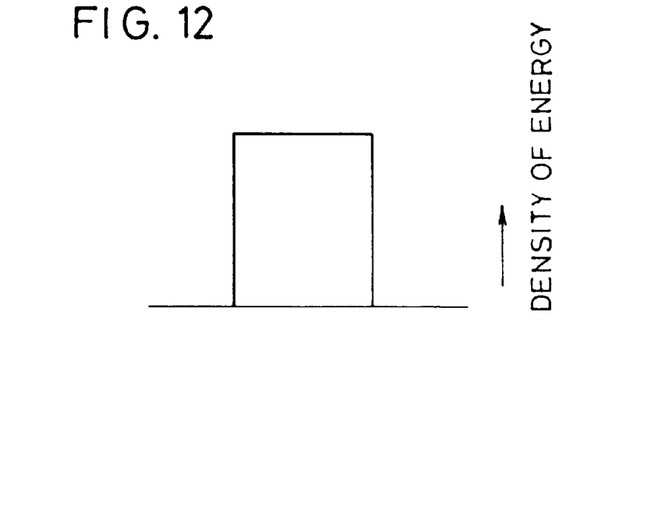
Figure 13A:
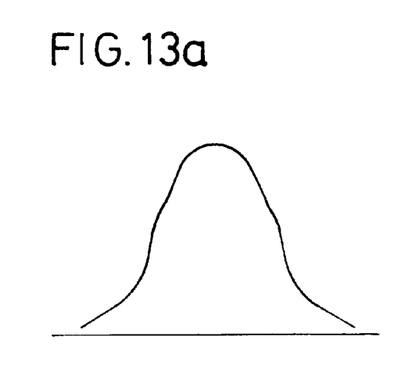
Figure 13B:
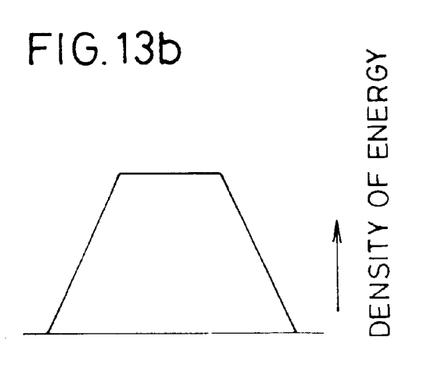

After the formatin of the opening 13 in the metal layer 16 of the multilayer substrate 11 as in the above, a carbon dioxide gas laser L was irradiated to the insulating layer 2 exposed in the opening 13 as in FIG. 2(*c*), and the non-penetrating via hole 3 bottomed by the conductor layer 1*a* was formed. The irradiation of the carbon dioxide gas laser was executed under conditions of more than 1 μs in pulse width so that the overall energy would be 8 mJ at working surface at an output of 150 W. While 1 shot irradiation should cause no trouble so long as the overall energy of 8 mJ could be attained, the irradiation may be performed sequentially as divided into a few shots as shown in FIG. 11 so that the overall energy would be 8 mJ, at a frequency of more than 100 Hz. In FIG. 11, the abscissa denotes time, the ordinate denotes peak power of the carbon dioxide gas laser L, P denotes one-shot pulse width, L denotes time (sec.) between respective shots, and the frequency is 1/L. Further, E is an energy per one shot and is proportional to an area of the pulse.

Figure 2:
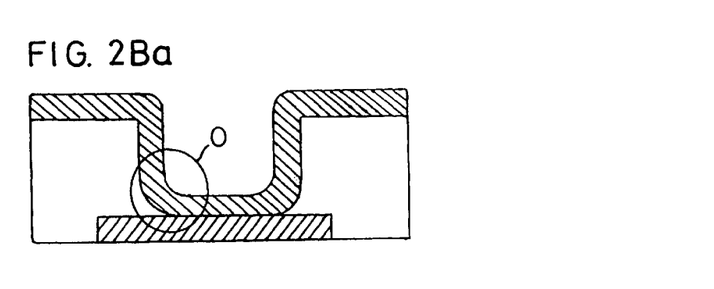
Figure 2A:
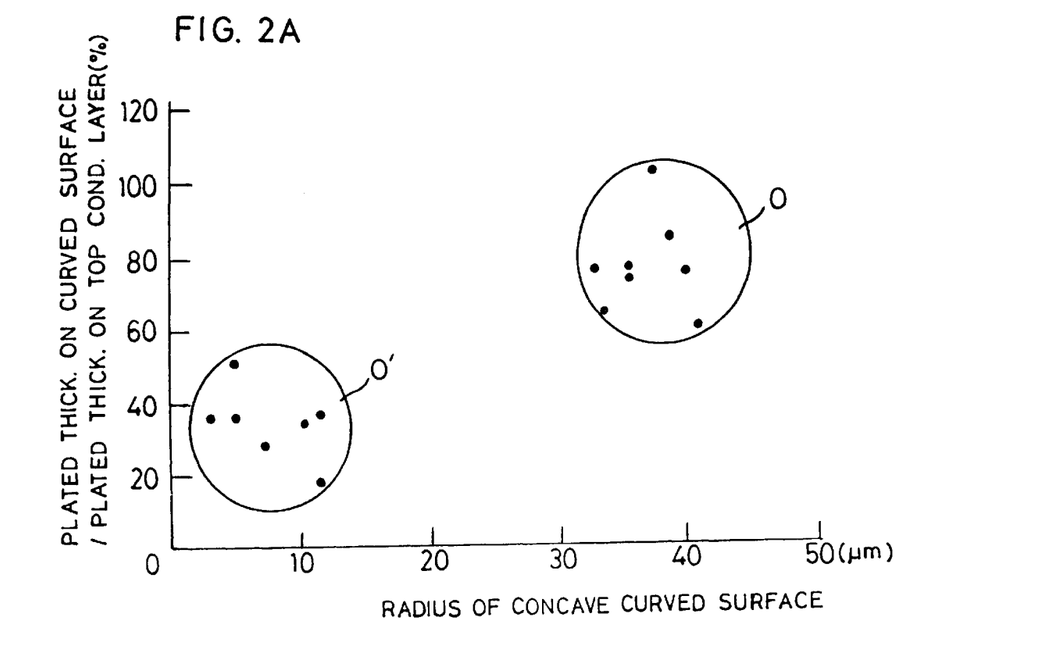
FIGS. 2(a) to 2(f) are fragmentary sectioned views showing more concretely the repective steps in the embodiment of FIG. 1 of the present invention.
Figure 2B:
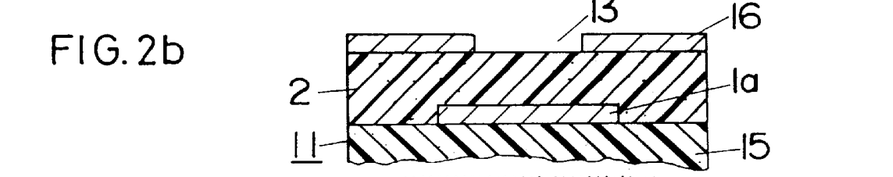
Figure 2C:
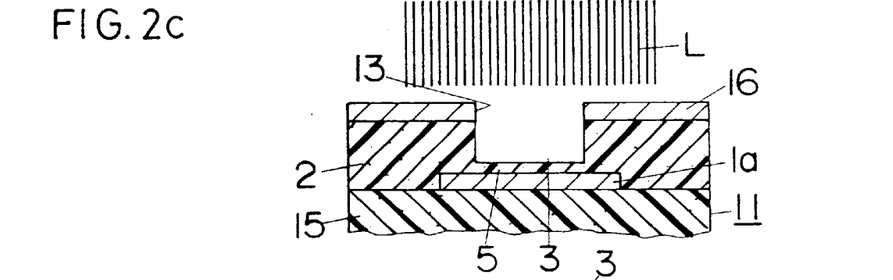

In the working aspect of FIG. 2, the opening 13 made in the metal layer 16 is formed to be of the same diameter as that of the via hole 3, and a beam diameter of the carbon dioxide gas laser L is set to be larger than the diameter of the opening 13, so that the insulating layer 2 will be worked with the carbon dioxide gas laser L which passes through the opening 13 to form the via hole 3. In the present instance, therefore, the via hole 3 can be formed in accurate dimension and at an accurate position without requiring the beam diameter of the carbon dioxide gas laser L to be set dimensionally, accurately nor requiring the position of irradiation of the laser L to be set accurately. In an event where the irradiation is executed with the beam diameter set to be larger than that of the opening 13, it should be preferable that the carbon dioxide gas laser L of a beam uniform in the energy distribution on working surface is employed. With the use of such carbon dioxide gas laser L uniform in the energy distribution, it is enabled to eliminate any variation in the configuration of the via hole 3 being formed, even when the irradiating position of the laser L is deviated.

Figure 2D:
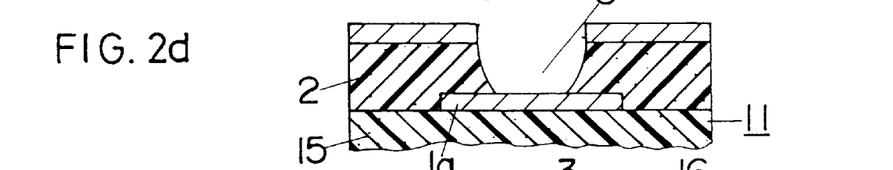

While a plated layer 4 is to be formed next inside the via hole 3, there is adhered on exposed surface of the bottoming conductor layer 1a in the via hole 3 an insulating substance 5 of the insulating layer 2 as remained without being completely removed during the formation of the via hole 3 in the insulating layer 2 by means of the foregoing carbon dioxide gas laser L, as in FIG. 2(c), and this remaining insulating substance 5 is to be removed in a manner as will be referred to later, so as to be as shown in FIG. 2(d).

According to the present invention, here, the inner periphery of the via hole 3 is so formed as to be a concave curved surface in the inner surface shape of the via hole 3 as axially sectioned, and this concave curved surface is set to be of a radius R preferably less than 100 μm, in particular, about 20 μm. While the radius R of the concave curved surface may be in this range so long as the via hole 3 is of an aspect ratio (depth of the hole/diameter of the hole) less than 0.4, the radius R of the concave curved surface should preferably be set to be in a range of 30 to 100 μm when the aspect ratio is more than 0.4. That is, it should be appreciated that, as shown in FIG. 2A, the thickness of the plated layer in the via hole with respect to the plated thickness on the top conductor layer remains smaller in such circular curved surface of a radius close to and less than 10 μm as shown by a circle O', whereas the thickness of the plated layer in continuing zone of the inner periphery to the bottom surface with respect to the thickness of top conductor layer is remarkably increased in such circular curved surface of a radius close to and more than 30 μm as shown by a circle O. While the upper limit of the aspect ratio is not specifically limited, an aspect ratio 1 will be the substantial upper limit, from a view point of the possibility of formation of the hole by means of the carbon dioxide gas laser L and of provision of uniform plating inside the via hole.

In executing the plating with respect to the via hole 3, such electroless plating as an electroless copper plating is first carried out to form a thin electrolessly plated film on the inner periphery of the via hole 3. Thereafter, such electroplating as an electro-copper-plating is performed with an electric current passed, and the plated layer 4 is formed as in FIG. 2(e). The plated layer 4 is formed not only on the inner wall and on the conductor layer 1a exposed at the bottom of the via hole 3, but also on the top surface of the metal foil 16. While the equipotential surfaces occurring inside the via hole 3 during this electroplating will be parallel to the inner periphery and bottoming surface of the conductor layer 1a of the via hole 3, the zone in which the inner periphery of the via hole 3 continues to the bottoming conductor layer 1a consists of a curved surface, so that the equipotential surfaces at this curved surface zone will be also curved and not angularly bent, as seen in FIG. 1(b). As the equipotential surfaces at such continuing zone of the inner periphery of the via hole 3 to the bottoming conductor layer 1a are thus curved, the electric lines of force intersecting at right angles the equipotential surfaces will not become coarse even at the continuing zone of the inner periphery of the via hole 3 to the bottoming conductor layer 1a, and the current density at the continuing zone is not reduced but can be rather unified. Further, the fluidity of the plating solution is improved at the continuing zone. Consequently, the plated layer 4, formed inside the via hole 3 through the electroplating is never thinned at the continuing zone of the inner periphery of the via hole 3 to the bottoming conductor layer 1a, and is to be formed with a uniform thickness.

In forming the plated layer 4 in the uniform thickness in this manner, it is necessary that the via hole 3 has an inner peripheral shape formed, in the axially section at the continuing zone of the inner periphery of the via hole 3 to the bottoming conductor layer 1a, to be the concave curved surface of a radius R more than 20 μm. When the via hole 3 is of an aspect ratio more than 0.4, then the via hole 3 should preferably be formed to be more than 30 μm in the radius R. Further, the via hole 3 should be of a diameter at the most of ϕ200 μm and, with the radius R made larger than 100 μm, the bottoming conductor layer 1a is not to be exposed in the via hole 3, the upper limit of the radius R should preferably be 100 μm.

Then, as has been referred to, the via hole 3 of the concave curved surface at the continuing zone of the inner periphery to the bottoming conductor layer 1a is formed through the processing of the via hole 3 with the irradiation of the carbon dioxide gas laser of the pulse width more than 1 μs. While the upper limit of the pulse width of the carbon dioxide gas is not specifically limited, it should be preferably less than 100 μs. Further, even when the insulating layer 2 is of varying thickness, the formation of the via hole 3 with the sequential irradiation of the carbon dioxide gas laser at a frequency of more than 100 Hz allows the via hole 3 to be formed in the concave curved surface at the intersecting, continuing zone of the inner periphery to the bottoming conductor layer 1a. The upper limit of the radiation frequency should preferably be less than 10 kHz, while not specifically limited.

Figure 2E:
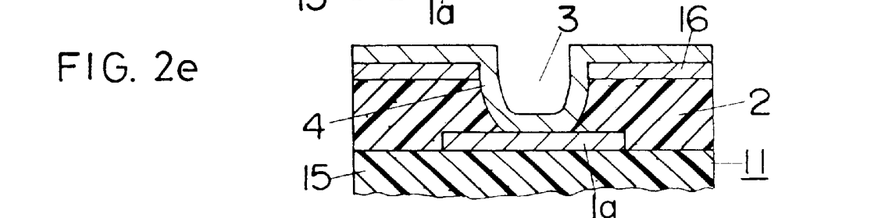
Figure 2F:
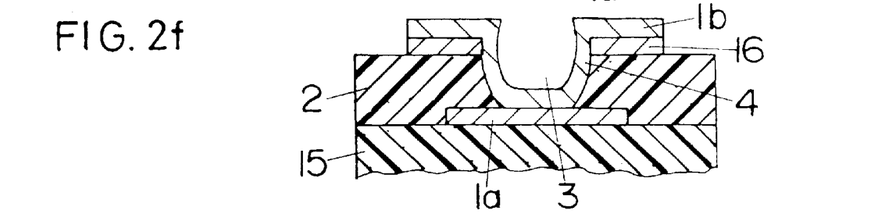

After forming the plated layer 4 inside the via hole 3 as has been described, the etching resist film (dry film) is applied to the surface of the multilayer substrate 11, the film is exposed to light and developed, and the metal layer 16 and plated layer 4 thereon are etched, so that a multilayer printed wiring board formed as in FIG. 2(f) can be obtained with a conductor layer 1b comprising the metal layer 16 and plated layer 4 made as an outer layer circuit. In this multilayer printed wiring board, the conductor layers 1a and 1b are mutually electrically connected through the plated layer 4 provided in the via hole 3, the plated layer 4 can be formed in the uniform thickness as shown in FIG. 2Ba in contrast to a finish of conventional plated layer as in FIG. 2Bb, because the continuing zone of the inner periphery to the bottom surface of the conductor layer 1a is concave-curved in the via hole 3 to prevent plating liquid from staying in such zone, so that the reliability of the electric connection between the conductor layers 1a and 1b can be elevated, and there arises no problem that any disconnection is caused by the heating upon mounting or by generated heat during use of mounted parts.

Figure 3A:
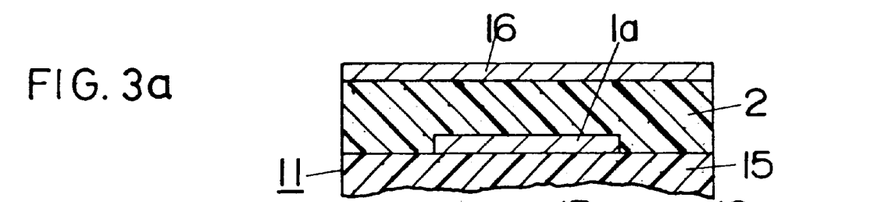
Figure 3B:
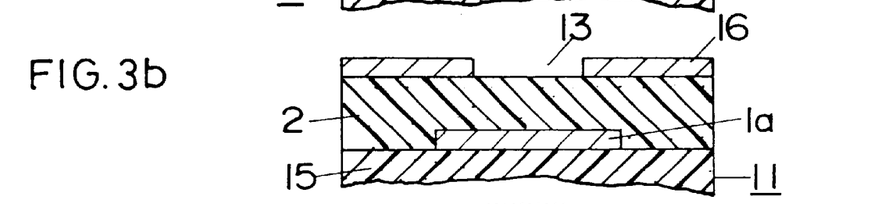
Figures 3C, 3D, 3E:
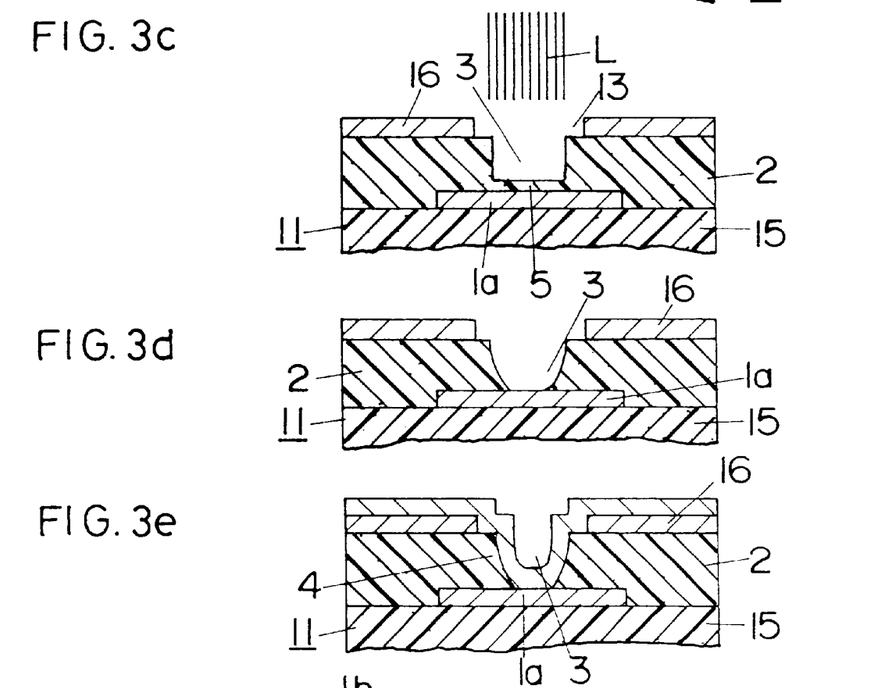
Figure 3F:
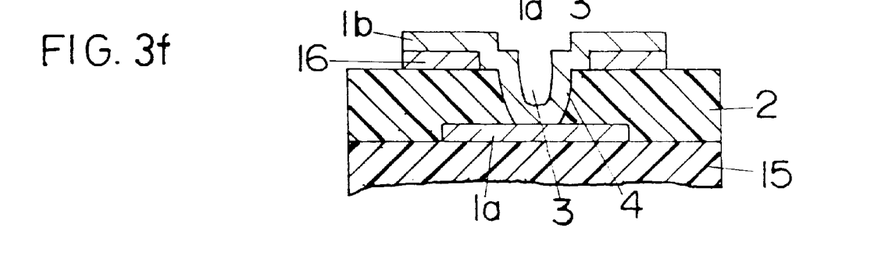

In another embodiment shown in FIGS. 3(a) to 3(f), the working with respect to the insulating layer 2 for forming the via hole 3 with the irradiation of the carbon dioxide gas laser L is carried out, as shown in FIG. 3(c), by setting the diameter of beam of the laser L to be smaller than the diameter of the opening 13 provided in the metal layer 16, and irradiating the laser L to the insulating layer 2 within the opening 13, to thereby form the via hole 3 in the layer 2. All other respects are the same as those in FIG. 2. While there has been a risk in the case of FIG. 2 that, as the via hole 3 and opening 13 are substantially equal to each other in the diameter, the metal layer 16 around the opening 13 may happen to protrude into the via hole 3 so as to render the plating performance deteriorated, the embodiment of FIG. 3 forms the via hole 3 in the smaller diameter than the opening 13 so that the metal layer 16 around the opening 13 does not protrude to the via hole 3 and the plating performance inside the via hole 3 can be made excellent.

In the event where the beam diameter of the carbon dioxide gas laser L is made smaller than that of the opening 13 so as not to reach the metal layer 16, it is desirable to employ a beam which has an energy distribution on the working surface to be higher at positions closer to the center of the beam. When the working is performed to form the via hole 3 with the carbon dioxide gas laser L of the beam of the higher energy distribution towards the center of the beam, it is possible to form the concave curved surface of a larger radius R in the continuing zone of the inner periphery of the via hole 3 to the bottoming conductor layer 1a. In an event where the via hole 3 is formed by irradiating the carbon dioxide gas laser L so as not to reach the metal layer 16 as seen in FIGS. 4(c) and 5(b) later described, it is similarly preferable to employ the laser L of the beam of the higher energy distribution towards the center of the beam.

Figure 4A:
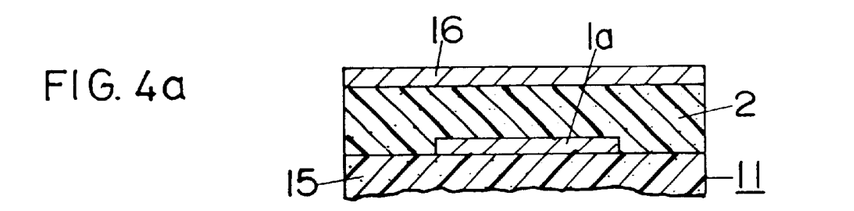
Figure 4B:
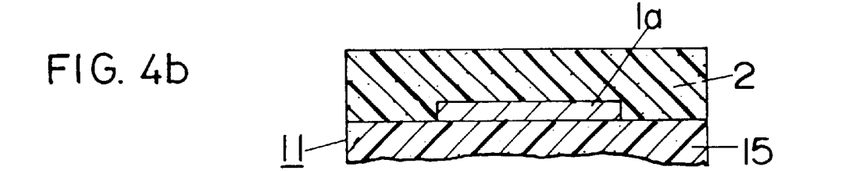
Figure 4C:
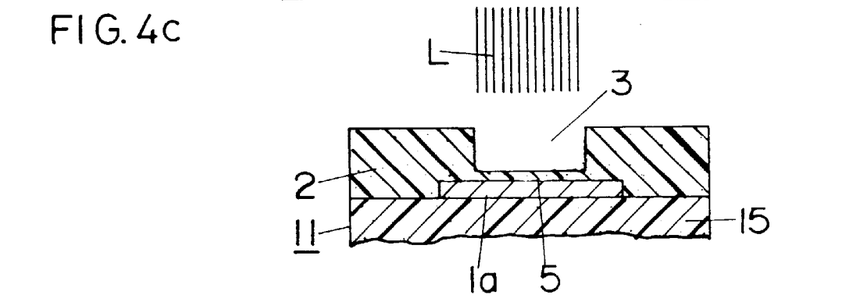
Figure 4D:
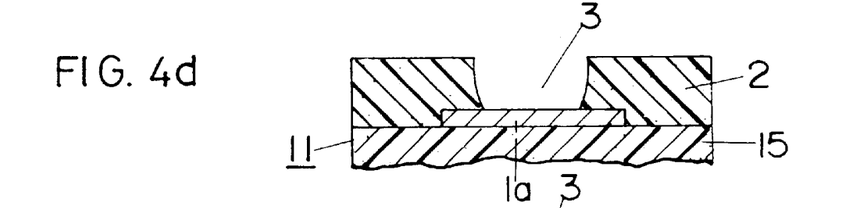

FIGS. 4(a) to 4(f) show another embodiment of the present invention, in which, as in FIG. 4(a), the multilayer substrate 11 is first prepared by laminating the metal layer 16 on the inner layering substrate 15 with the insulating layer 2 interposed similarly to FIG. 2(a). That is, an epoxy resin varnish comprising as main components bisphenol A epoxy resin and dicyandiamide and generally employed for manufacturing the FR-4 type laminate is applied to the bonding surface (mat finished) of a copper foil which is 18 μm thick by means of the comma coater, so as to be 70 μm thick after being dried, the applied varnish was heated to be dried under conditions of 150° C. and 20 minutes, so as to be half-set (B stage), and a copper foil lined with resin is prepared. These resin-lined copper foils are placed over both surfaces of the inner layering substrate 15 with the resin side of the foils faced to the substrate, and the multilayer substrate 11 in which the inner layering substrate 15 carries the metal layer 16 laminated through the insulating layer 2, as shown in FIG. 4(a), is obtained. Since in the present instance the insulating layer 2 is laminated on the surface of the inner layering substrate 15 through the metal layer 16 as heated and compressed, a high bond strength can be attained between the inner layering substrate 15 and the insulating layer 2.

Next, as in FIG. 4(b), the metal layer 16 on the surface is removed overall by means of the etching. In this state where the whole surface of the insulating layer 2 is exposed with the metal layer 16 removed, the carbon dioxide gas laser L is irradiated in the same manner as in FIG. 3(c), and the via hole 3 is formed in the insulating layer 2. As in the case of FIG. 2(d) further, the insulating substance 5 remaining on the surface of the bottoming conductor layer 1a in the via hole 3 is removed, as in FIG. 4(d).

Figure 4E:
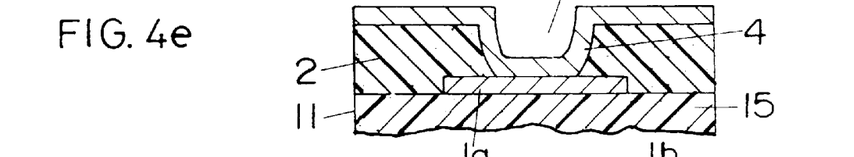
Figure 4F:
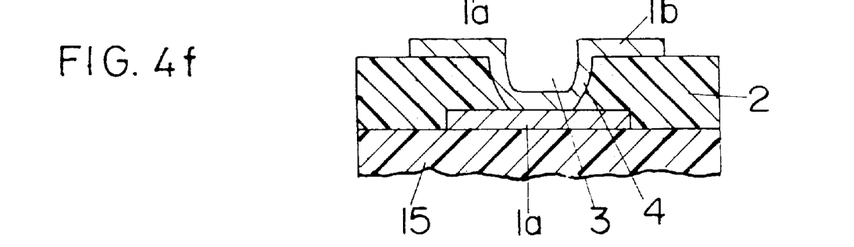

Thereafter, in the same manner as in FIG. 2(e), the electroless plating and electro-plating are carried out to form the plated layer 4 within the via hole 3, upon which the plated layer 4 is formed not only inside the via hole 3 but also all over the surface of the insulating layer 2, as in FIG. 4(e). Then, the etching resist film (dry film) is applied to the surface of the plated layer 4 formed all over the insulating layer 2, such film is subjected to the exposure to light and to the development, and a multilayer printed wiring board in which a conductor layer 1b comprising the plated layer 4 is formed as the outer layered circuit through the etching as in FIG. 4(f) is obtained.

Since in this multilayer printed wiring board the conductor layers 1a and 1b are mutually electrically connected through the plated layer 4 provided inside the via hole 3 and this plated layer 4 is formed in the uniform thickness as has been disclosed, it is possible to render the reliability of the electric connection between the conductor layers 1a and 1b to be high, and to eliminate the risk of causing disconnection due to the heating upon mounting or generated heat of the mounted parts being used.

In the foregoing embodiment of FIG. 2 or 3 (as well as conventional ones), the plated layer 4 is formed not only inside the via hole 3 but also all over the metal layer 16 as in FIG. 2(e) or 3(e) so that the conductor layer 1b forming the outer layered circuit will comprise two layers of the metal layer 16 and plated layer 4 so as to be thick, and the circuit formation in a fine pattern is difficult to attain, whereas the embodiment of FIG. 4 allows the conductor layer 1b forming the outer layered circuit to be formed with the thin plated layer 4 only, and the circuit formation is enabled to be made in the fine pattern.

Figure 5A:
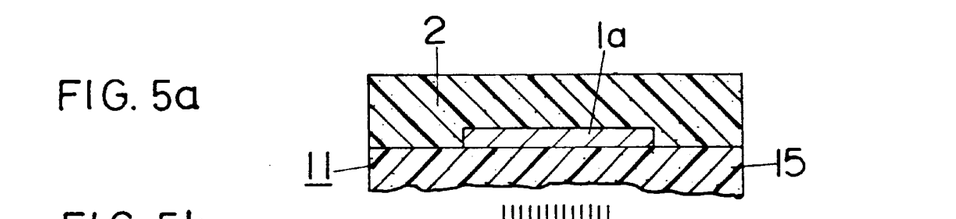
Figure 5B:
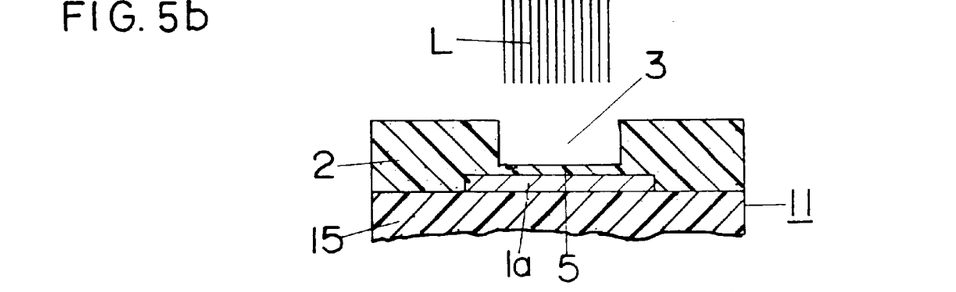
Figure 5C:
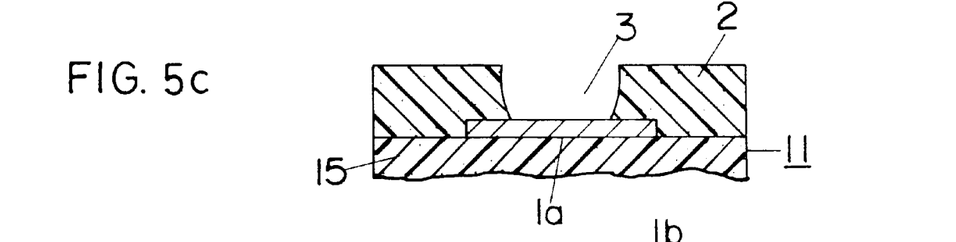
Figure 5D:
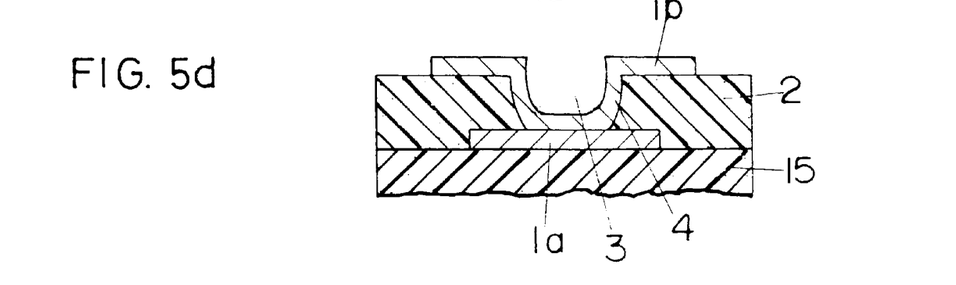
Figure 6A:
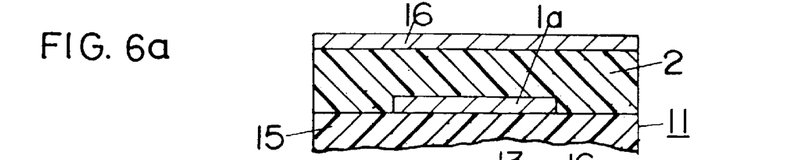
Figure 6B:
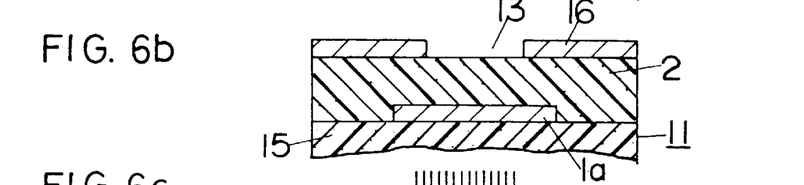
Figure 6C:
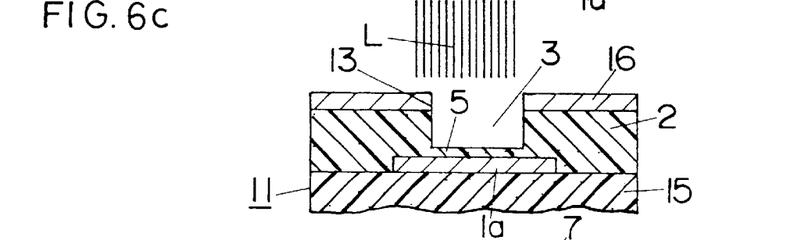
Figure 6D:
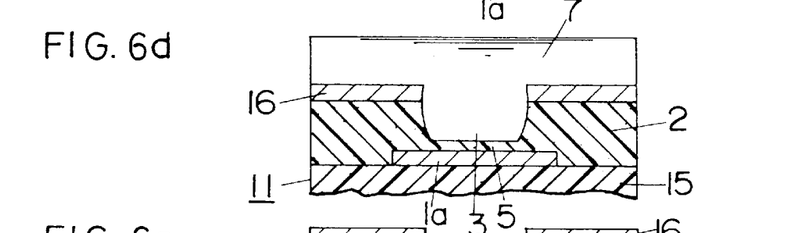
Figure 6E:
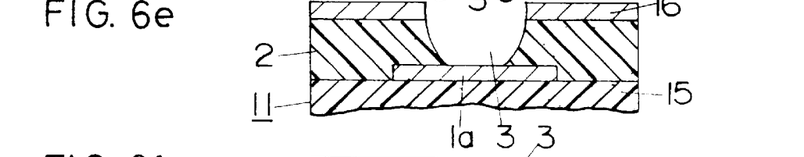
Figure 6F:
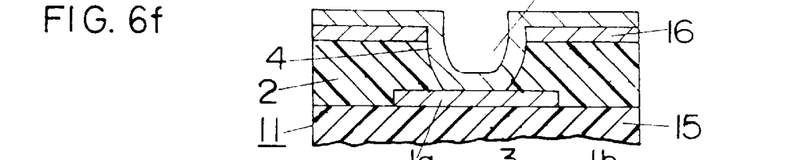
Figure 6G:
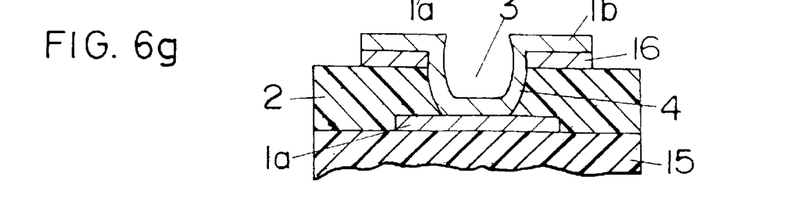

FIGS. 5(a) to 5(d) show another embodiment of the present invention, in which the epoxy resin varnish comprising as main components bisphenol A epoxy resin and dicyandiamide and generally employed for manufacturing the FR-4 type laminate is applied to both surfaces of such inner layering substrate 15 as in the case of FIG. 2(a) by means of the comma coater so as to be 70 μm thick after being dried, and is set as being heated under the conditions of 150° C. and 120 minutes, whereby such multilayer substrate 11 as in. FIG. 5(a) in which the insulating layer 2 is formed on both surfaces of the inner layering substrate. 15 is prepared. Thereafter, the carbon dioxide gas laser L is irradiated likewise the step of FIG. 4(c) to provide the via hole 3 in the insulating layer 2 as in FIG. 5(b), and the insulating substance 5 remaining on the surface of the bottoming conductor layer 1a in the via hole 3 is removed as in FIG. 5(c) likewise the step of FIG. 4(d) Further, in the same manner as in the steps of FIGS. 4(e) and 4(f) the plated layer 4 is formed, the conductor layer 1b comprising the plated layer 4 is formed as the outer layered circuit, and such multilayer printed wiring board as in FIG. 5(d) can be obtained.

In this multilayer printed wiring board, the conductor layers 1a and 1b are mutually electrically connected through the plated layer 4 provided inside the via hole 3, and the plated layer 4 is formed in the uniform thickness as has been referred to, so that the reliability in the electric connection between the conductor layers 1a and 1b can be made high, and any risk of disconnection due to the heat upon the mounting or the generated heat of the mounted parts being used can be eliminated. It is also enabled to form the circuit in fine pattern, since the conductor layer 1b forming the outer layered circuit can be formed only with the thin plated layer 4 likewise the case of FIG. 4. Further, while the metal layer 16 has to be etched off in the case of FIG. 4, the board in the case of FIG. 5 is not provided with the metal layer 16 and renders such etching-off step to be unnecessary.

Next, references shall be made to the process for removing the insulating substance 5 remaining on the surface of the bottoming conductor layer 1a in the via hole 3 during the formation of the via hole 3 in the insulating layer 2 by means of the carbon dioxide gas laser L. FIGS. 6(a) to 6(g) show substantially the same board manufacturing steps as those of FIGS. 2 (a) to 2 (f) and only a step of FIG. 6(d) for removing the insulating substance 5 shall be described. That is, after the formation of the via hole 3 in the insulating layer 2 of the multilayer substrate 11 by irradiating the carbon dioxide gas laser L, the multilayer substrate 11 is dipped in a permanganic acid solution to treat inside surface of the via hole 3 with the permanganic acid solution, and the insulating substance 5 remaining on the surface of the conductor layer 1a is oxidized and decomposed to be removed. For the permanganic acid solution, an aqueous solution of potassium permanganate may be used.

Referring to a practical example of the treatment using the permanganic acid solution 7, the multilayer substrate 11 is first dipped for 5 minutes in a solution "MLB211" by a firm SIPLAY and controlled at 80° C. for swelling treatment, and thereafter the multilayer substrate 11 is further dipped for 5 minutes in a solution "MLB213" which is the solution of potassium permanganate by the same manufacturer and heated to 80° C. for the oxidizing and decomposing treatment. Then, after being rinsed, the multilayer substrate 11 is dipped for 5 minutes in a 10% aqueous solution of sulphuric acid to neutralized any treatment residue and is further rinsed so that the insulating substance 5 remaining on the surface of the conductor layer 1a can be removed by means of the permanganic acid solution 7.

With such removal of the insulating substance remaining on the surface of the bottoming conductor layer 1a in the via hole 3, the conduction between the conductor layer 1a and the plated layer 4 is no more obstructed, and the reliability in the electric connection between the conductor layers 1a and 1b through the plated layer 4 in the via hole 3 can be elevated. In executing this treatment of the insulating substance 5 with the permanganic acid solution as in the above, the treatment can be easily carried out by the dipping or the like operation of the multilayer substrate 11 in the permanganic acid solution, the treatment can be performed with respect to a large number of the substrates in a lump, and the treatment can be made at low costs.

Figure 7A:
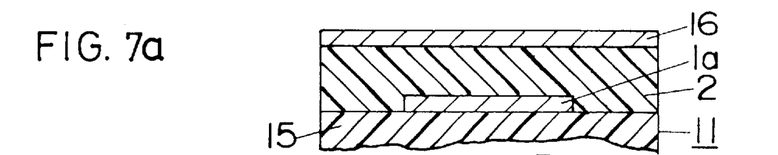
Figure 7B:
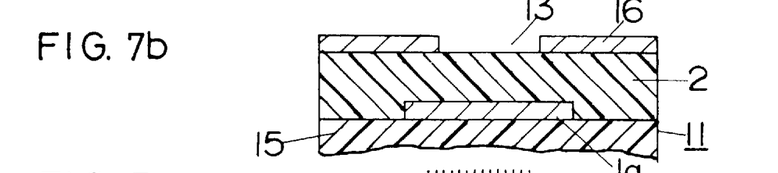
Figure 7C:
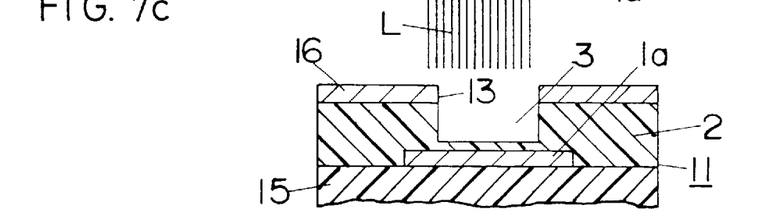
Figure 7D:
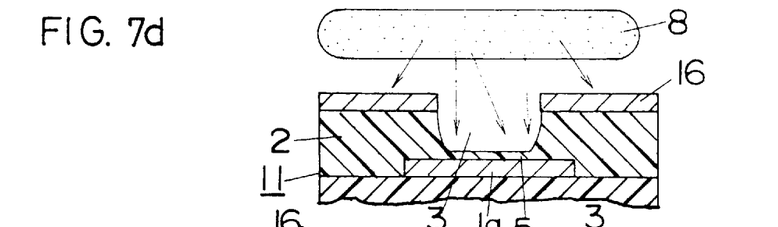
Figures 7E, 7F:
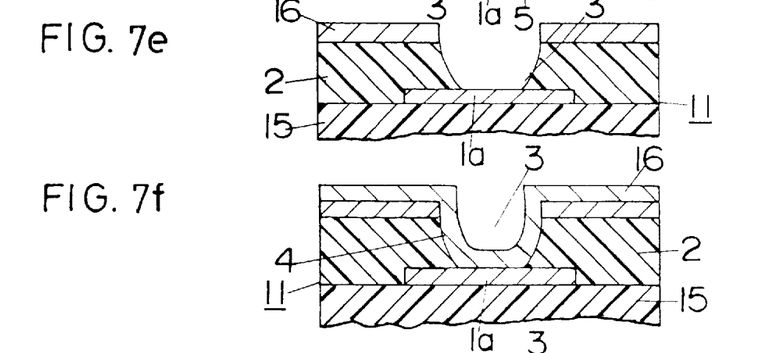
Figure 7G:
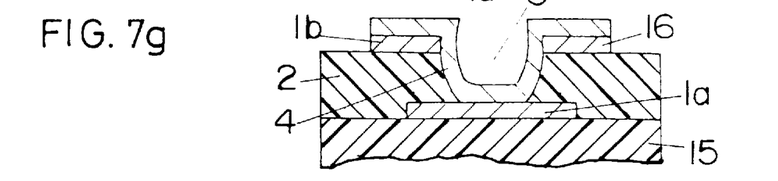

FIGS. 7(a) to 7(g) show substantially the same steps as those of FIGS. 2(a) to 2(f), but including another example of the process for removing the insulating substance 5 remaining on the surface of the bottoming conductor layer 1a in the via hole 3, and only FIG. 7(d) showing the step of removing the insulating substance 5 shall be described. That is, after the formation of the via hole 3 in the insulating layer 2 of the multilayer substrate 11 with the irradiation of the charbon dioxide gas laser L, the insulating substance 5 remaining on the surface of the conductor layer 1a is decomposed to be removed by treating the multilayer substrate 11 by means of a plasma 8 generated with a reactive gas containing at least one of oxygen and fluorine.

Referring to a practical example of the plasma treatment, a vacuum chamber is evacuated to 0.0001 Torr, then a mixture gas of Ar gas (flow rate 50 cc/min) and oxygen gas (flow rate 50 cc/min) is led into the vacuum chamber, CF4 gas (flow rate 50 cc/min) is additionally led into the chamber as occasion demands, the interior pressure of the vacuum chamber is made to be 0.1 Torr, the multilayer substrate 11 provided with the via hole 3 is placed in this vacuum chamber, the plasma 8 is generated by applying for several minutes a plasma application power of 60 W (of a high frequency 13.56 MHz) and the insulating substance 5 remaining on the surface of the bottoming conductor layer 1a in the via hole 3 can be decomposed and removed by the plasma 8.

With such removal of the insulating substance 5 remaining on the surface of the bottoming conductor layer 1a in the via hole 3, the reliability of the electric connection between the conductor layers 1a and 1b through the plated layer 4 inside the via hole 3 can be elevated. When the removal of the insulating substance 5 is performed with such chemical solution as the permanganic acid solution as in the above, there arises a possibility that the remaining insulating substance 5 on the surface of the conductor layer 1a cannot be completely removed in an event when the solution contains bubbles due to insufficient deaeration, whereas the plasma treatment involves no such problem of the insufficient deaeration and is capable of completely removing the remaining insulating substance 5 on the conductor layer 1a, and the high reliability of the electric connection between the conductor layers 1a and 1b through the plated layer 4 can be obtained.

Figure 8A:
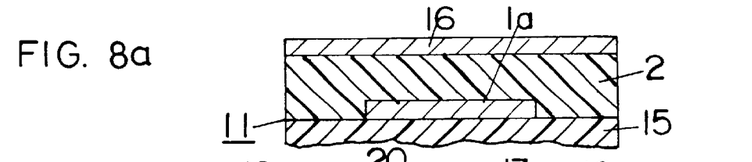
Figure 8B:
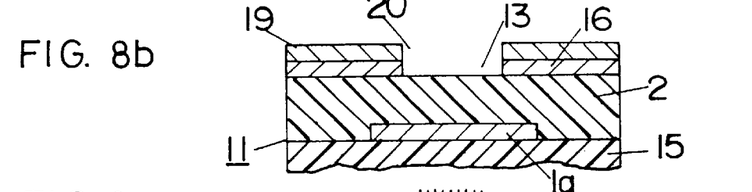
Figure 8C:
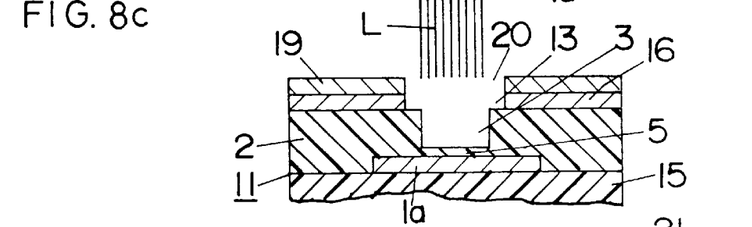

FIGS. 8(a) to 8(g) show another process of removing the remaining insulating substance 5 on the bottoming conductor layer 1a in the via hole 3, in which the multilayer substrate 11 is first prepared as in FIG. 8(a) by laminating the insulating layer 2 and metal layer 16 on the inner layering substrate 15 in the same manner as in FIG. 2(a) and then such etching resist 19 as the dry film or the like is applied to the surface of the metal layer 16 to cover it. The etching resist 19 is subjected to the exposure to light and development to form an opening 20 with the etching resist 19 removed at the position where the via hole 3 is to be formed, and thereafter the metal layer 16 at the part where via hole 3 is to be made is removed by etching off the metal layer 16 through the opening 20 so as to form the opening 13 in the metal layer 16, as in FIG. 8(b). Then, as in the case of FIG. 3(c), the carbon dioxide gas laser L is irradiated onto the insulating layer 2 through the openings 20 and 13 to form the via hole 3 as in FIG. 8(c)

Figure 8D:
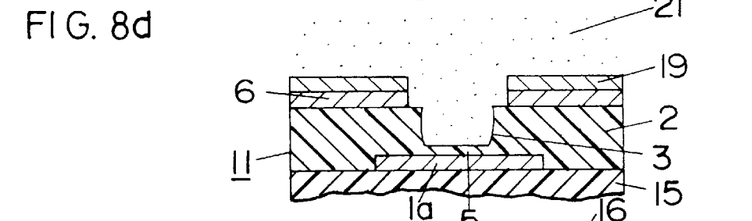

Thereafter, as in FIG. 8(d), a blasting abrasive grain 21 is sprayed to perform a blasting treatment, and the insulating substance 5 remained on the bottoming conductor layer 1a in the via hole 3. The blasting treatment by means of a blast device can be performed by spraying for several seconds an alumina powder of a grain size of 5 $\mu$m, for example, as the abrasive grain, under an air pressure of 5 kg/cm². In executing the blasting treatment here, it is preferable that the abrasive grain 21 is sprayed with the etching resist 19 left as it is, so that the metal layer 16 or insulating layer 2 for forming the outer conductor layer 1b will not be damaged.

Figure 8E:
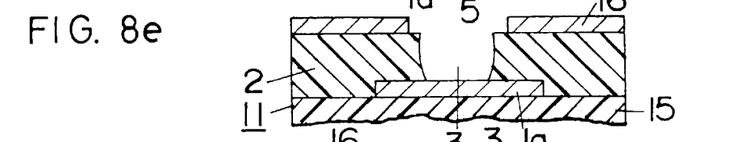
Figure 8F:
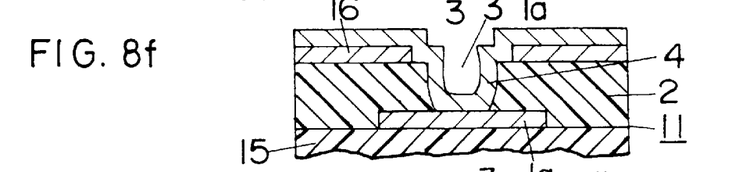
Figure 8G:
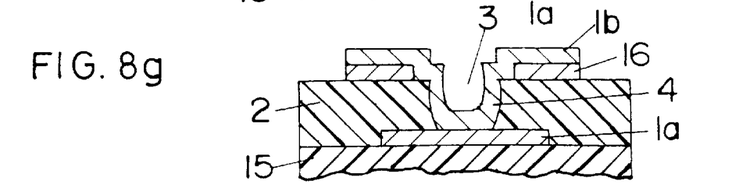

After the removal of the remaining insulating substance 5 on the conductor layer 1a with the blasting treatment, the etching resist 19 is removed as in FIG. 8(e). Then, likewise the case of FIGS. 2(e) and 2(f), the plated layer 4 is formed as in FIG. 8(f), and such multilayer printed wiring board as in FIG. 8(g) can be obtained by forming further the conductor layer 1b acting as the outer layered circuit.

Thus, by the removal of the remaining insulating substance 5 on the bottoming conductor layer 1a in the via hole 3, it is possible to elevate the reliability of the electric connection between the conductor layers 1a and 1b through the plated layer 4 inside the via hole 3. By executing the treatment of insulating substance 5 by means of the blasting treatment, any such problem as the insufficient deaeratin of the chemical solution in the case of treatment with the permanganic acid solution or the like employed can be eliminated, the remaining insulating substance 5 on the conductor layer 1a can be completely removed, and the reliability of the electric connection between the conductor layers 1a and 1b through the plated layer 4 can be made high. Further, the blasting treatment is lower in costs for the installation than in the case of the plasma treatment, and the removing treatment can be performed at lower costs.

FIGS. 9(a) to 9(g) show another example of process for removing the remaining insulating substance 5 on the bottoming conductor layer 1a in the via hole 3. First, likewise the case of. FIG. 5(a), the insulating layer 2 is formed by coating with a resin the surface of the inner layering substrate 15, as in FIG. 9(a). Next, a blasting resist 6 is adhered to the surface of this insulating layer 2. For this blasting resist 6, such films of polyurethanes as a high elasticity dry film resist of urethanes (such as "ORDIL SV"—trade name—of TOKYO OHKA KOGYO as one available in the market) may be used. At this time, as shown in FIGS. 10 (a) and 10(b), the insulating layer 4 with the metal layer 16 laminated thereon is formed likewise the case of FIGS. 4(a) and 4(b), and the blasting resist 6 may be adhered to the surface of the insulating layer 2 after removing the metal layer 16 by the etching or the like means.

Figure 9A:
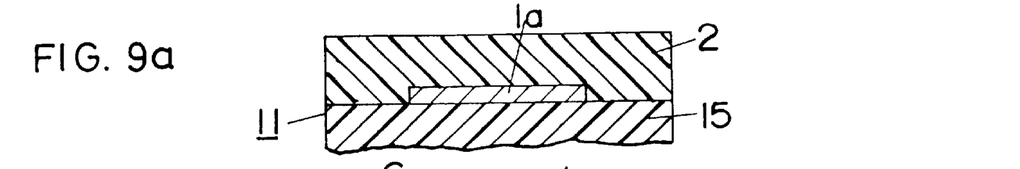
Figure 9B:
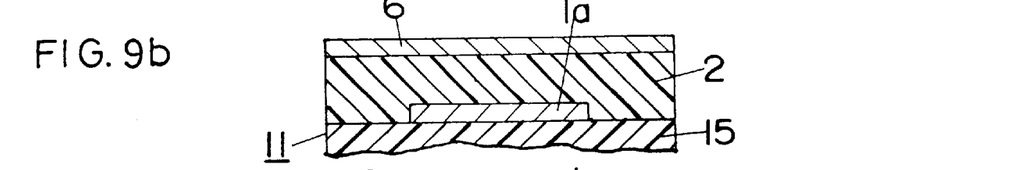
Figure 9C:
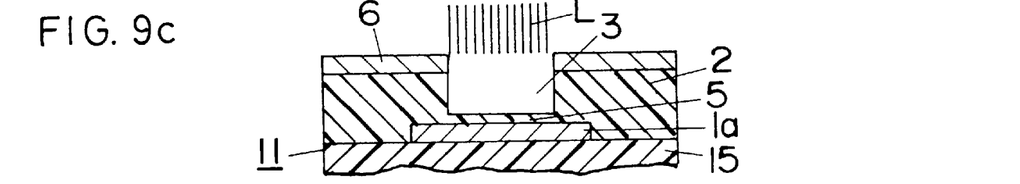
Figure 9D:
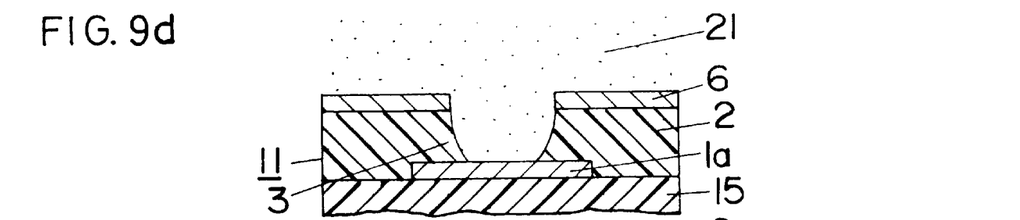
Figure 10A:
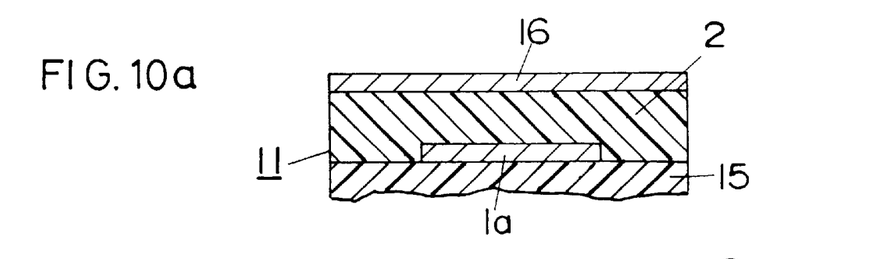
Figure 10B:
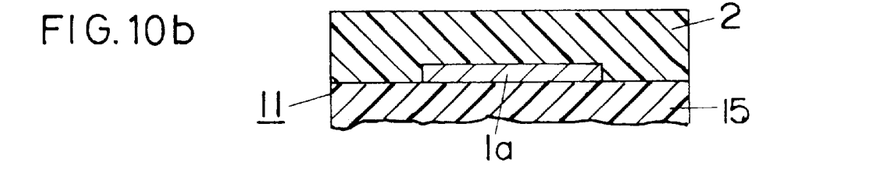

Then, the carbon dioxide gas laser L is irradiated as in FIG. 9(c), and the blasting resist 6 and insulating layer 2 are removed at the part where the laser L has been irradiated, so as to form the via hole 3 in the insulating layer 2. Conditions for the laser irradiation are the same as those which have been already described.

Thereafter, likewise the case of FIG. 8(d), the remaining insulating substance 5 on the bottoming conductor layer 1a in the via hole 3 is removed. Thus, during the blasting treatment, the insulating layer 2 is protected as covered by the blasting resist 6, and the insulating layer 2 can be prevented from being damaged by the abrasive grain 21 during the blasting treatment.

Figure 9E:
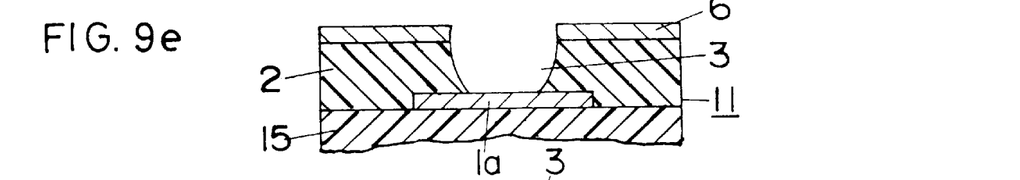
Figure 9F:
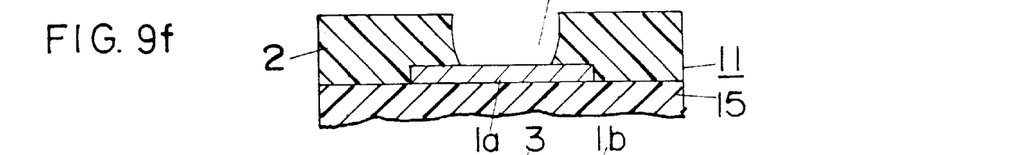
Figure 9G:
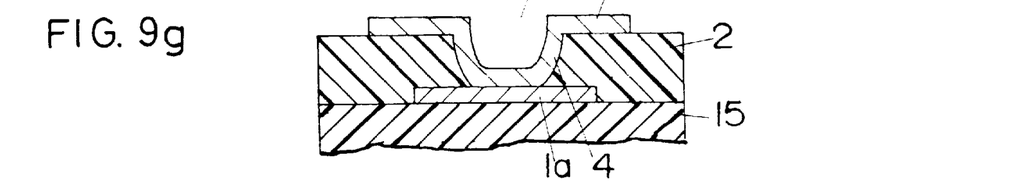

After the removal of the remaining insulating substance 5 on the conductor layer 1a with the blasting treatment as in the above, the blasting resist 6 is removed as in FIG. 9(e), then the plated layer 4 is formed as in FIG. 9(f) likewise the case of FIGS. 2(e) and 2(f) the conductor layer 1b acting as the outer layered circuit is further formed, and the multilayer printed wiring board as shown in FIG. 9(g) can be thereby obtained.

With such removal of the remaining insulating substance 5 on the bottoming conductor layer 1a in the via hole 3, it is enabled to render the reliability of the electric connection between the conductor layers 1a and 1b through the plated layer 4 inside the via hole 3 to be high. With such blasting treatment for removing the remaining insulating substance 5, the problem due to the insufficient deaeration of the chemical solution in the case of the treatment with the permanganic acid solution can be eliminated, the remaining insulating substance 5 on the conductor layer 1a can be completely removed, and the reliability of the electric connection between the conductor layers 1a and 1b through the plated layer 4 can be made high. Further, the blasting treatment requires lower costs for the installation than in the case of the plasma treatment, and the treatment can be performed at lower costs.

What is claimed is:

1. A method for manufacturing a multilayer printed wiring board in which a plurality of conductor layers are laminated as a whole with insulating layers interposed, comprising the steps of irradiating the insulating layers with a carbon dioxide gas laser having a pulse width in a range of 1 to 100 $\mu$s to form a non-penetrating via hole in the insulating layer as bottomed by each conductor layer exposed so as to have, at least at a continuing zone of the inner periphery to the bottom surface, a concave curved surface of a radius of more than 20 $\mu$m in an axially sectioned view of the via hole, forming a plated conductor layer inside the via hole for electric connection between the conductor layers, preparing an inner layering substrate having a wiring pattern forming the conductor layer bottoming the via hole, adhering through the insulating layer a thermosetting resin onto the inner layering substrate a metal foil forming another conductor layer to be electrically connected to the wiring pattern through the plated layer, etching the metal foil to remove a portion thereof where the via hole is to be provided, irradiating the carbon dioxide gas laser of a beam larger in the diameter than a diameter of the portion where the foil is etched off to remove the insulating layer at the portion to thus form the via hole, and providing the plated layer with an electrically conducting substance through a plating for electrically connecting the wiring pattern and the metal foil.

2. The method according to claim 1 characterized in that the laser is a carbon dioxide layer that is sequentially irradiated at a frequency of more than 100 Hz for forming the via hole.

3. The method according to claim 1 characterized in that the board is manufactured by the steps of preparing an inner layering substrate having a wiring pattern forming the conductor layer bottoming the via hole, adhering through the insulating layer a thermosetting resin onto the inner layering substrate a metal foil forming another conductor layer to be electrically connected to the wiring pattern through the plated layer, removing through an etching the metal foil at a portion where the via hole is to be provided, using a carbon dioxide gas laser to provide a beam of radiation smaller in diameter than a diameter of the portion where the metal foil is etched off to remove the insulating layer at the portion to thus form the via hole and for providing the plated layer with an electrically conducting substance through a plating for electrically connecting the wiring pattern an the metal foil.

4. The method according to claim 3, characterized in that the carbon dioxide gas laser employed for forming the via hole is of an energy distribution high in the center on the working surface.

5. The method according to claim 1, characterized in that the carbon dioxide gas laser employed for forming the via hole is of a uniform energy distribution on a working surface.

6. The method according to claim 1 in which the board is manufactured by the steps of preparing an inner layering substrate having a wiring pattern forming the conductor layer bottoming the via hole, forming the insulating layer on the inner layering substrate, directing a beam of radiation from a carbon dioxide gas laser onto the insulating layer to remove a portion thereof to form the via hole, and thereafter providing through a plating process the plated layer inside the via hole and a plated conductor layer on the insulating layer with an electrically conducting substance, the plated conducting layer on the insulating layer forming the conductor layer electrically connected through the plated layer inside the via hole to the wiring pattern, wherein said insulating layer is formed by applying, drying and setting a layer of a thermosetting resin over wiring pattern on the inner layer substrate.

7. The method according to claim 1 in which the board is manufactured by the steps of preparing an inner layering substrate having a wiring pattern forming the conductor layer bottoming the via hole, adhering through the insulating layer of a thermosetting resin onto the inner layering substrate a metal foil, removing the metal foil through an etching process, directing a beam of a carbon dioxide gas laser onto the thermosetting resin of the insulating layer to remove the resin and to form the via hole, and providing the plated layer inside the via hole and a plated conductor layer on the insulating layer with an electrically conducting substance through a plating process, the plated conducting layer on the insulating layer forming the conductor layer being electrically connected through the plated layer inside the via hole to the wiring pattern, wherein said metal foil is removed overall through the etching.

8. A method for manufacturing a multilayer printed wiring board in which a plurality of conductor layers are laminated as a whole with insulating layers interposed therebetween, comprising the steps of irradiating the insulating layers with a carbon dioxide gas laser having a pulse width in a range of 1 to 100 $\mu$s to form a non-penetrating via hole in the insulating layer as bottomed by each conductor layer exposed so as to have, at least at a continuing zone of the inner periphery to the bottom surface, a concave curved surface of a radius of more than 20 $\mu$m in an axially sectioned view of the via hole, forming a plated conductor layer inside the via hole for electric connection between the conductor layers, and applying a permanganic acid solution for removing any remaining insulating substance on the bottoming conductor layer in the via hole.

9. A method for manufacturing a multilayer printed wiring board in which a plurality of conductor layers are laminated as a whole with insulating layers interposed, comprising the steps of forming a non-penetrating via hole by means of irradiation by a laser in the respective insulating layers from an opening made in one of the conductor layers on one surface of the insulating layer to a surface of another conductor layer on the other surface of the insulating layer, and forming a plated conductor layer on the inner periphery of the via hole for electric connection between the conductor layers on both surfaces of the respective insulating layer, including forming the via hole in the insulating layer, so as to have, at least at a continuing zone or the inner periphery to tie bottom surface, a concave curved surface of a radius of more than 20 $\mu$m in an axially sectioned view of the via hole.

* * * * *